(12) United States Patent
Gorman et al.

(10) Patent No.: US 12,266,415 B1
(45) Date of Patent: Apr. 1, 2025

(54) RELIABLE ELECTRONIC FUSE BASED STORAGE USING ERROR CORRECTION CODING

(71) Applicant: Marvell Asia Pte Ltd, Singapore (SG)

(72) Inventors: Kevin William Gorman, Essex Junction, VT (US); Paul J. Grzymkowski, Middlesex, VT (US); John R. Goss, Essex Junction, VT (US)

(73) Assignee: Marvell Asia Pte Ltd, Singapore (SG)

( * ) Notice: Subject to any disclaimer, the term of this patent is extended or adjusted under 35 U.S.C. 154(b) by 155 days.

(21) Appl. No.: 18/101,586

(22) Filed: Jan. 26, 2023

Related U.S. Application Data

(60) Provisional application No. 63/326,963, filed on Apr. 4, 2022.

(51) Int. Cl.
*G11C 29/54* (2006.01)
*G06F 11/10* (2006.01)

(52) U.S. Cl.
CPC .......... *G11C 29/54* (2013.01); *G06F 11/1044* (2013.01)

(58) Field of Classification Search
CPC ............................ G11C 29/54; G06F 11/1044
USPC ........................................ 714/721, 758, 763
See application file for complete search history.

(56) References Cited

U.S. PATENT DOCUMENTS

| | | |
|---|---|---|
| 7,224,633 B1 | 5/2007 | Hovis et al. |
| 7,254,078 B1 | 8/2007 | Park et al. |
| 8,050,129 B2 * | 11/2011 | Liu ................. G11C 17/18 365/96 |
| 8,234,543 B2 | 7/2012 | Henry et al. |
| 11,961,576 B2 * | 4/2024 | Nadeau-Dostie ...... G11C 29/72 |
| 2007/0241768 A1 | 10/2007 | Erickson et al. |
| 2008/0158933 A1 | 7/2008 | Allen et al. |
| 2009/0310266 A1 | 12/2009 | Etherton et al. |
| 2011/0035623 A1 * | 2/2011 | Gaskins ............ G06F 11/10 712/42 |
| 2011/0083057 A1 * | 4/2011 | Huang ............... G11C 17/16 714/E11.032 |
| 2013/0173970 A1 * | 7/2013 | Kleveland ........... G11C 29/50 714/710 |
| 2022/0188185 A1 * | 6/2022 | Seyedzadeh ........... G06F 11/10 |
| 2023/0139634 A1 | 5/2023 | Chang et al. |
| 2023/0185633 A1 * | 6/2023 | Varadarajan .......... G06F 9/5016 718/104 |

* cited by examiner

*Primary Examiner* — Albert Decady
*Assistant Examiner* — Osman M Alshack
(74) *Attorney, Agent, or Firm* — Meitar Patents Ltd.; Daniel Kligler

(57) ABSTRACT

An apparatus for reliable fuse-based storage in an Integrated Circuit (IC) includes a plurality of electronic fuses and processing logic. The electronic fuses store (i) data bits, (ii) parity bits that were generated from the data bits in accordance with an Error Correction Code (ECC) scheme, and (iii) access information required for accessing the data bits and the parity bits. The processing logic receives a read command for reading given data bits from the electronic fuses, based on the read command retrieves access information specifying given electronic fuses storing the given data bits and given parity bits associated with the given data bits, using the access information reads the given data bits and the given parity bits from the given electronic fuses, applies the ECC scheme to the given data bits and the given parity bits, using the ECC module to generate corrected data bits, and outputs the corrected data bits.

18 Claims, 4 Drawing Sheets

RELIABLE ELECTRONIC FUSE BASED STORAGE USING ERROR CORRECTION CODING

CROSS-REFERENCE TO RELATED APPLICATIONS

This application claims the benefit U.S. Provisional Patent Application 63/326,963, filed Apr. 4, 2022, whose disclosure is incorporated herein by reference.

FIELD OF THE DISCLOSURE

The present disclosure relates generally to fuse-based configuration of electronic circuits, and particularly to methods and systems for reliable storage of data in electronic fuses using error correction coding.

BACKGROUND

An Electronic Fuse (eFuse) is a circuit structure designed to hold binary information depending on whether the eFuse is blown or unblown. eFuses are sometimes used in electronic Integrated Circuits (ICs), e.g., to hold information for configuring the IC at power up or boot.

Certain aspects of using electronic fuses in ICs are addressed in U.S. Pat. No. 7,254,078, entitled "System and method for increasing reliability of electrical fuse programming" which is assigned to the assignee of the present patent application and whose disclosure is incorporated herein by reference, and in U.S. Pat. No. 8,234,543, entitled "Detection and correction of fuse re-growth in a microprocessor".

The description above is presented as a general overview of related art in this field and should not be construed as an admission that any of the information it contains constitutes prior art against the present patent application.

SUMMARY

An embodiment that is described herein provides an apparatus for reliable fuse-based storage in an Integrated Circuit (IC), the apparatus including a plurality of electronic fuses, an ECC module, and processing logic. The electronic fuses are configured to store (i) data bits, (ii) parity bits that were generated from the data bits in accordance with an Error Correction Code (ECC) scheme, and (iii) access information required for accessing the data bits and the parity bits. The ECC module is configured to apply the ECC scheme to the data bits and corresponding parity bits for correcting errors in the data bits. The processing logic configured to receive a read command for reading given data bits from the electronic fuses, based on the read command to retrieve access information specifying given electronic fuses storing the given data bits and given parity bits associated with the given data bits, using the access information to read the given data bits and the given parity bits from the given electronic fuses, to apply the ECC scheme to the given data bits and the given parity bits, using the ECC module to generate corrected data bits, and to output the corrected data bits.

In some embodiments, the processing logic is configured to read the access information by reading a start location and an end location of a range of the electronic fuses among the plurality of electronic fuses. In other embodiments, the processing logic is configured to provide a Built-In Self-Repair (BISR) controller that is coupled to the apparatus via an interface, with reliable indirect access to data stored in the plurality of electronic fuses. In yet other embodiments, the interface supports generic signals that are applicable by the BISR for direct access to electronic fuses other than the electronic fuses in the plurality of electronic fuses.

In an embodiment, the processing logic includes a rewritable memory, which is configured to store temporary data bits to be written to the electronic fuses or read from the data fuses, and the processing logic is configured to calculate temporary parity bits corresponding to the temporary data bits in the rewritable memory using the ECC module. In another embodiment, a number of the temporary data bits is smaller than an input size required by the ECC scheme, and the processing logic is configured to pad the temporary data bits with one or more padding bits to complete the input size required by the ECC scheme. In yet another embodiment, the processing logic is configured, prior to writing any data to the plurality of electronic fuses, to perform a fuse test for verifying that the electronic fuses being initially unblown, under control of an external device by disabling the ECC module and providing direct access to the electronic fuses.

In some embodiments, the ECC module supports multiple ECC schemes, and the processing logic is configured to select one of the ECC schemes depending on a number of the given data bits. In other embodiments, the processing logic is configured to receive a write command specifying input data bits, and an address indicative of first electronic fuses for storing the input data bits, to apply the ECC scheme to the input data bits, using the ECC module, to generate input parity bits corresponding to the input data bits, to determine access information indicative of the first electronic fuses, and of second electronic fuses for storing the input parity bits, and to store (i) the input data bits in the first electronic fuses, (ii) the input parity bits in the second electronic fuses, and (iii) the access information in third electronic fuses.

There is additionally provided, in accordance with an embodiment that is described herein, a method for reliable fuse-based storage in an Integrated Circuit (IC), the method including, in an apparatus comprising a plurality of electronic fuses storing (i) data bits, (ii) parity bits that were generated from the data bits in accordance with an Error Correction Code (ECC) scheme, and (iii) access information required for accessing the data bits and the parity bits, receiving a read command for reading given data bits from the electronic fuses. Based on the read command, access information specifying given electronic fuses storing the given data bits and given parity bits associated with the given data bits is retrieved. Using the access information the given data bits and the given parity bits are read from the given electronic fuses. The ECC scheme is applied to the given data bits and the given parity bits to generate corrected data bits, and the corrected data bits are output.

The present disclosure will be more fully understood from the following detailed description of the embodiments thereof, taken together with the drawings in which:

DETAILED DESCRIPTION OF EMBODIMENTS

Figure 1:
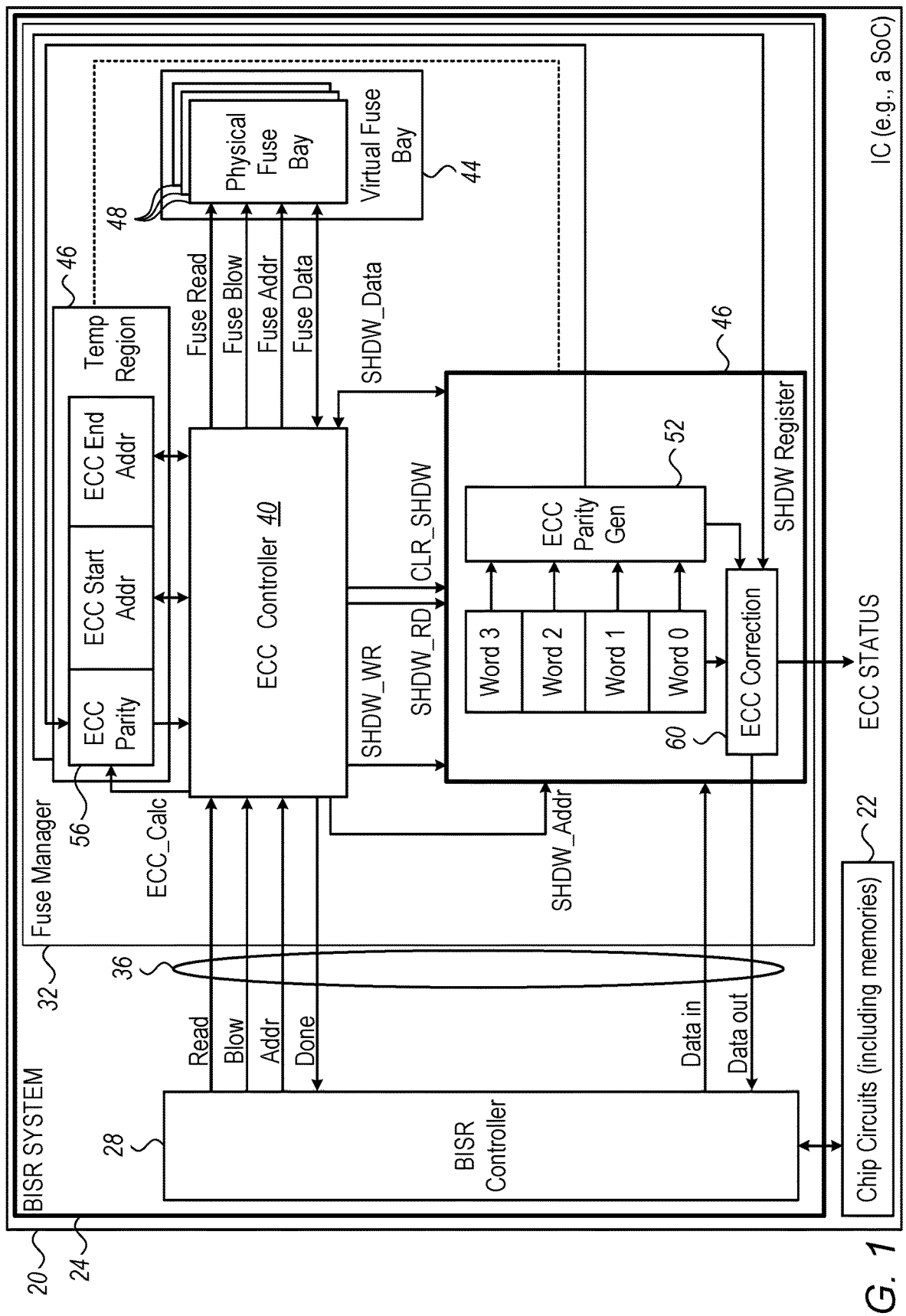
FIG. 1 is a block diagram that schematically illustrates an Integrated Circuit (IC) with reliable Electronic Fuse (eFuse) based storage, in accordance with an embodiment that is described herein.

Various electronic ICs such as a System on Chip (SoC) contain multiple built in electronic fuses, also referred to as "eFuses". Electronic fuses are also referred to herein simply as "fuses" for brevity.

Electronic fuses are initially manufactured in an unblown state and may be later blown electronically, as required. In some applications, the fuses are programmed once, e.g., at manufacturing but read many times during the IC's lifetime.

The electrical resistance of an eFuse depends on its unblown/blown state. When unblown, the fuse typically has a low electrical resistance (e.g., of a short circuit), whereas after being blown it has a much higher resistance. The eFuse may be deemed as holding a binary value depending on its unblown or blown state. The binary value of an eFuse may be read, for example, by evaluating the resistance of the fuse, and comparing this resistance to a specified threshold.

The reliability of eFuses may degrade over time. For example, the resistance of a blown fuse may decrease with time and usage, eventually causing the fuse to falsely read as unblown. For retaining an overall reliability level of a fuse storage in an IC, the manufacturer typically specifies an upper limit to the number of fuses embedded in the IC. The manufacturer may also specify an upper limit to the number of times the fuses may be read before they wear out.

Electronic fuses are often used within complex Built-In Self-Repair (BISR) systems in ICs. The BISR system gathers repair data across the IC, e.g., during post manufacturing tests, and stores the repair data in eFuses within the IC. In the field (when being used in a target application), e.g., upon power up or boot, the BISR system reads the repair data back from the eFuses and distributes them across the IC to configure the IC accordingly. Reading false information from the fuses, e.g., due to reliability degradation, may result in partial or complete malfunction of the IC.

In principle, fuse reliability degradation could be mitigated by storing the same bit value in multiple fuses. For example, in the programming phase the BISR would write the same binary value to two fuses (rather than a single fuse), and upon reading the BISR would read the two fuses, and if one or both read as blown, the final value read is blown. The main disadvantage of this approach is that it would double the number of fuses required, possibly exceeding the overall number of fuses allowed in the IC.

In the disclosed embodiments, degradation in fuse reliability is mitigated by protecting the data stored in the fuses using an Error Correcting Code (ECC). To this end, at a writing phase, an ECC scheme is applied to input data bits to produce corresponding parity bits, and both the data bits and parity bits are stored in eFuses.

Moreover, information for accessing the data bits and parity bits is also stored in eFuses. Upon reading, the data bits and parity bits are read from the eFuses based on the access information, and the ECC scheme is applied to correct errors in the data bits and/or parity bits. Depending on the ECC used, the parity bits may increase the required fuse storage by about 78 to 11%, which even with the access information is much less than doubling the fuse storage as described above.

Consider an apparatus for reliable fuse-based storage in an Integrated Circuit (IC), the apparatus comprising a plurality of electronic fuses, an ECC module and processing logic. The plurality of electronic fuses comprises (i) data fuses configured to store data bits, (ii) parity fuses configured to store parity bits that were generated from the data bits in accordance with an Error Correction Code (ECC) scheme, and (iii) control fuses configured to store information required for accessing the data fuses and the parity fuses. The data fuses, parity fuses and control fuses typically are physical fuses having the same fuse structure. The ECC module is configured to apply the ECC scheme to data bits and corresponding parity bits for correcting errors in the data bits. The processing logic is configured to receive a read command for reading given data bits, the read command is indicative of given control fuses storing access information for accessing given data fuses in which the given data bits are stored, and given parity fuses in which given parity bits associated with the given data bits are stored, to access the given control fuses to read the access information, to read, based on the access information, the given data bits from the given data fuses, and the given parity bits from the given parity fuses, to apply the ECC scheme, using the ECC module, to the given data bits and the given parity bits to generate corrected data bits, and to output the corrected data bits.

The access information may specify the location of the data fuses storing the requested data bits in various ways. In an example embodiment, the processing logic is configured to read access information by reading a start location and an end location of a range of the given data fuses among the data fuses.

In some embodiments, the processing logic is configured to provide a Built-In Self-Repair (BISR) controller that is coupled to the apparatus via an interface, with reliable indirect access to the plurality of electronic fuses. The processing logic thus mediates between the external device (BISR) and the fuses. In an embodiment, the interface between the BISR and processing logic comprises a generic interface that may provide the device direct access to fuses with no ECC protection. In such embodiments, the device or BISR is unaware of accessing the electronic fuses indirectly. The generic interface may comprise generic signals that are applicable by the device for direct access to electronic fuses other than the electronic fuses in the plurality of electronic fuses.

In some embodiments data is exchanged with the fuses via a local storage area also referred to as a shadow register. To this end, the processing logic comprises a rewritable memory, which stores temporary data bits to be written to the data fuses or read from the data fuses. The processing logic calculates temporary parity bits corresponding to the temporary data bits in the rewritable memory using the ECC module.

In some embodiments, the number of temporary data bits in the rewriteable memory is smaller than the input size required by the ECC scheme. In such cases the processing logic pads the temporary data bits with one or more padding bits to complete the input size required by the ECC scheme.

In an embodiment, the processing logic performs a fuse test for verifying that the electronic fuses being initially unblown, under the control of an external device, e.g., after manufacturing and prior to writing any data to the plurality of electronic fuses. To this end, the processing logic disables the ECC module and provides direct access to the electronic fuses.

In some embodiments, the ECC module supports multiple ECC schemes corresponding to different input sizes. In such embodiments, the processing logic is configured to select one of the ECC schemes depending on a number of the given data bits. This feature may be used so that different applications have a fixed number of data bits protected by a selected ECC, or by one application supporting multiple different data sizes to protected using respective ECC schemes.

In some embodiments, the processing logic is configured to receive a write command specifying input data bits to be stored in selected data fuses, and an address indicative of the selected data fuses. The processing logic is configured to apply the ECC scheme to the input data bits, using the ECC module, to generate input parity bits corresponding to the input data bits, to determine access information indicative of the selected data fuses, and of selected parity fuses for storing the parity bits, and to store (i) the input data bits in the selected data fuses, (ii) the input parity bits in selected parity fuses, and (iii) the access information in selected control fuses.

In the disclosed techniques, processing logic, also referred to herein as an ECC controller mediates between a conventional BISR controller and a virtual fuse bay comprising one or more physical fuse bays. The ECC controller receives write and read commands from the BISR controller and handles reliable storage of data in the virtual fuse bay using an ECC. The BISR controller itself has no direct access to the physical fuse bays and is essentially unaware of any error correction done to data read from the physical fuse bays. The ECC controller supports multiple configurable data size to be protected using the underlying ECC scheme.

FIG. 1 is a block diagram that schematically illustrates an Integrated Circuit (IC) 20 with reliable Electronic Fuse (eFuse) based storage, in accordance with an embodiment that is described herein.

IC 20, also referred to herein as a "chip", may comprise, for example, a System on a Chip (SoC) or any other suitable type of an IC. Chip 20 comprises chip circuits 22 and a Built-In Self-Repair (BISR) system 24. The chip circuits may perform various tasks required for implementing the desired functionality of chip 20. BISR 24 serves for performing on the chip various selected post manufacturing tests and storing repair data in the fuses, and for configuring the chip based on the retrieved repair data, e.g., at power up or boot.

In some embodiments, chip circuits 22 comprise memories (not shown) that may serve for example, as L1 and/or L2 caches for CPUs on the chip, and/or for any other storage purposes. The underlying chip may contain tens of thousands of such memories. In some embodiments, the memories embedded in the chip may contain faulty addresses that cannot be used. The repair data may contain configuration information that allows avoiding the faulty addresses in the memories.

The number of physical fuses required to store the repair data may be on the order of several thousands of fuses (e.g., 4500 fuses). In an embodiment, The BISR distributes the configuration information retrieved from the fuses across the chip, e.g., for storage in dedicated registers of the chip circuits associated with the memories. Alternatively or additionally, the BISR system may generate repair data for configuring elements in the chip other than memories. For example, in an embodiment, the BISR system may configure chip elements associated with replacing logic circuits that have failed during post manufacturing tests. The BISR system may also configure elements to calibrate sensors such as temperature or voltage sensors, based on post manufacturing test results. The BISR system may also adjust memory timing and margin settings based on post manufacturing test results. In addition, the BISR system may also configure elements to store in the data fuses unique IC specific data during post manufacturing test (e.g., chip Identification values, chip performance information, boot code, firmware, security keys or other unique data values that may need to be accessed at power up or boot). BISR system 24 comprises a BISR controller 28 coupled to a fuse manager 32 via a BISR interface 36. Fuse manager 32 comprises an ECC controller 40, a virtual fuse bay 44, and a shadow register 46 (also referred to as SHDW Register or SHOW Reg, in FIG. 1). Virtual fuse bay 44 comprises one or more physical fuse bays 48, each of which comprising multiple physical eFuses (not shown in the figure for the sake of clarity). The physical eFuses may have any suitable structure and may be built from any suitable material such as metal or silicon-based material(s). As will be described in detail below, the physical fuse bays store repair data as well as metadata for accessing the repair data. The ECC controller makes the physical fuse bays virtually appear to the BISR controller as a single large physical fuse bay that stores the repair data.

In the present context and in the claims, the term "electronic fuse" refers to any one-time programmable circuit device capable of storing binary values that represent blown and un-blown states.

In an embodiment, BISR interface 36 comprises a generic interface used by conventional BISR systems for accessing electronic fuses directly. Generic interface 36 typically comprises signals such as: Read, Blow, Addr, Data in, and Data out.

In performing a write operation, in an embodiment, the BISR controller inserts input data bits to be written, into the Data in lines, along with an address (inserted into the Adrr lines) indicative of a location among the physical fuses in which the input data bits are to be stored. The BISR controller activates the Blow signal to write the input data bits to the physical fuses.

In performing a read operation, the BISR controller places an address on the Addr lines, indicative of a location among the physical fuses from which to read, activates the Read signal, and receives the data bits read from the physical fuse bay via the Data Out lines of the interface. In some embodiments, a Done signal indicates to the BISR controller that the write or read operation has concluded. It is noted that BISR controller 28 can only access physical fuse bays 48 via the ECC controller and has no direct access to the physical fuse bays.

ECC controller 40 intercepts signals that the BISR controller generates for accessing the fuse bays, and generates, based on the intercepted signals, internal control signals for accessing the physical fuses in physical fuse bays 48. The ECC controller accesses the fuse bays using signals such as Fuse Read, Fuse Blow, Fuse Addr, and Fuse Data.

ECC controller 40 interfaces with shadow register 46 using signals such as: SHDW_WR, SHDW_RD, SHDW_Addr, SHDW_Data, ECC_Calc and SHDW_CLR.

Shadow register 46 comprises a rewritable memory for temporarily storing data to be written to the fuse bays or data read from the fuse bays. Shadow register also comprises a temporary region 56 that will be described below. The rewritable memory may be built from multiple registers, as a volatile memory such as a Random Access Memory (RAM), as a nonvolatile memory such as a Flash memory, or as a combination of several different storage technologies. In the present example, the rewritable memory comprises four 32-bit words denoted Word0 . . . . Word3, for storing up to 128 data bits concurrently. The ECC controller accesses each of Word0 . . . . Word3 by placing a corresponding shadow address on the SHDW_Addr lines and reading or writing 32 data bits, from or to corresponding 32 fuses via the SHOW data lines.

Upon reading a 32-bit word from the fuse bays, the ECC controller stores the read word in one of Word0 . . . . Word3 by placing the relevant address on the SHDW_Addr lines, placing the word bits on the SHDW_data lines, and activating the SHDW_WR signal. Upon writing the content of one of Word0 . . . Word3 to the fuse bays, the ECC controller places the relevant address on the SHDW_Addr lines, activates the SHOW RD signal, and retrieves the word bits via the SHOW data lines.

As will be described in detail below, in some embodiments, data bits are stored in the physical fuse bays in fuse storage units referred to herein as "ECC regions". The size of the ECC region is configurable, e.g., depending on the underlying application. The data bits stored in each ECC region are protected using ECC. The semiconductor fabrication plant (FAB) in which the chip has been manufactured may specify that ECC protection is required for a given number of fuses (e.g., for every 1024 fuses or 128 fuses on average). For achieving a certain reliability level, a small sized (or large sized) ECC region may be selected. For example, assuming Word0 . . . . Word3 are 32-bit wide, the ECC region size may be selected to 64 bits, 96 bits or 128 bits, for example. In an embodiment, the underlying ECC scheme supports multiple ECC schemes, and the ECC controller selects one of the ECC schemes, e.g., depending on the number of data bits stored in the ECC regions.

Temporary region 56 uses a rewritable memory for temporarily storing information related to the ECC regions. As will be described below, the content of the temporary region is stored in physical fuses when performing a write operation and retrieved from the physical fuses when performing a read operation.

In the present example, temporary region 56 comprises an ECC Start Addr and an ECC End Addr, specifying a range of physical fuses storing the data bits of the ECC region. The temporary region also includes an ECC parity field, specifying the parity bits corresponding to the data bits stored in the ECC region.

Fuse manager 32 comprises an ECC parity generator 52 that generates parity bits for the data stored in Word0 . . . Word3 in accordance with the underlying ECC scheme. The ECC scheme may comprise any suitable ECC scheme for correcting any suitable number of correctable errors, and/or for detecting any suitable number of detectable errors. For example, the underlying ECC scheme may comprise a Single Error Correction-Double Error Detection (SEC-DED) code such as, for example, a Hamming code that generates 8 parity bits for 64 input bits, or 9 parity bits for 128 input bits.

An error correction module 60, receives as inputs (i) the stored parity bits from temporary region 56, (ii) the generated parity bits from ECC parity generator 52, and (iii) the data bits retrieved from Word0 . . . . Word3, and produces corrected data bits based on these inputs. The error correction module outputs a status signal denoted "ECC status" that indicates whether decoding the ECC has succeeded or failed. For example, a failure status may indicate that the retrieved data bits and parity bits contain a number of errors beyond the correction capabilities of the underlying ECC.

Although in the disclosed embodiments (e.g., as depicted in FIG. 1 and other figures that will be described below) the underlying ECC scheme (implemented using ECC parity generator 52 and ECC correction module 60) generates a code word comprising the original input data bits and additional parity bits, other suitable ECC schemes may also be used. For example, an ECC scheme generating a code word with redundancy bits but without preserving the original data bits can also be used.

In some embodiments, the ECC controller supports bypassing the ECC scheme for accessing the physical fuses directly. This may be used, for example, in testing the IC after production, as will be described, with reference to FIG. 4 below.

Figure 2:
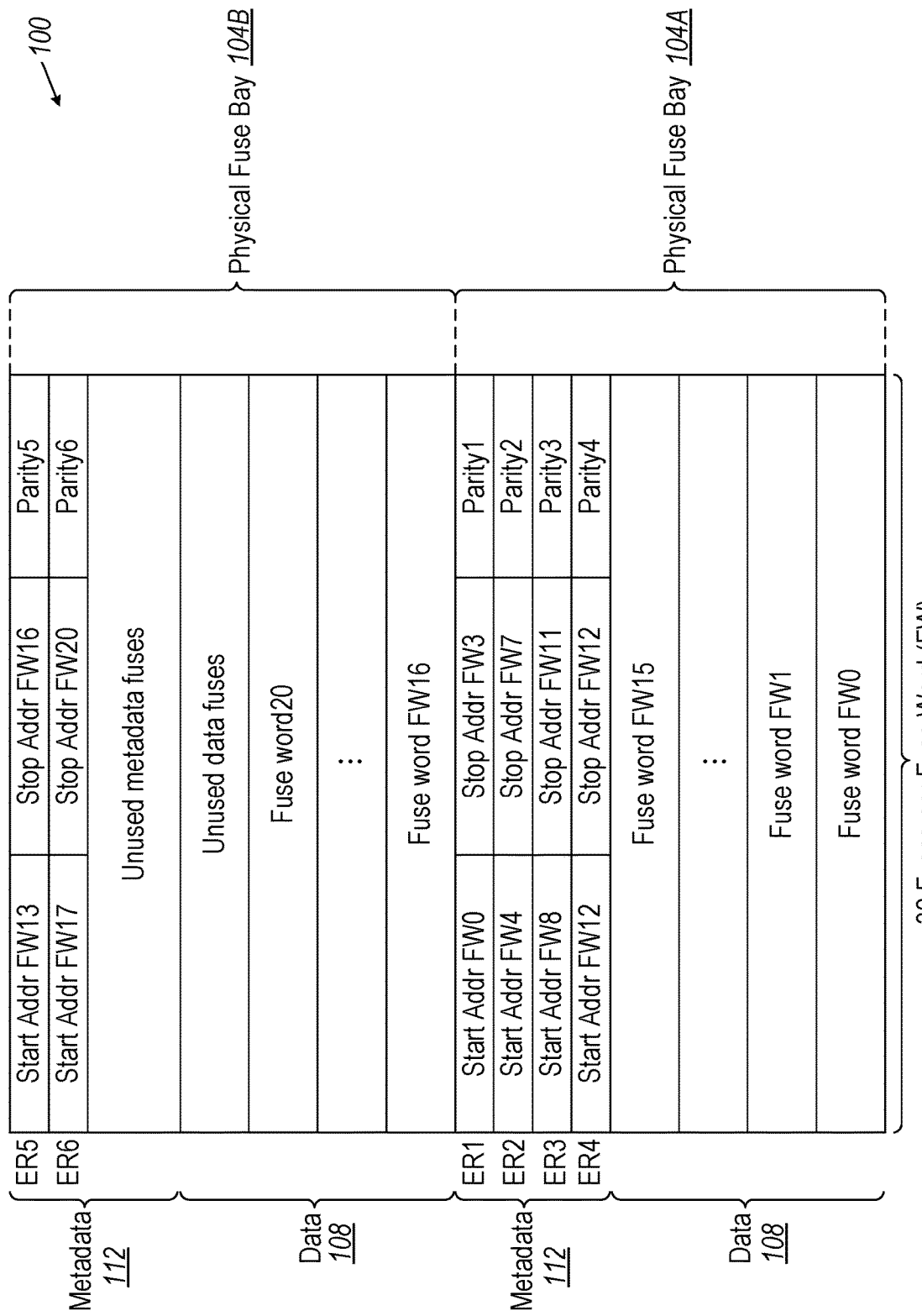
FIG. 2 is a diagram that schematically illustrates a virtual fuse bay, in accordance with an embodiment that is described herein.

FIG. 2 is a diagram that schematically illustrates a virtual fuse bay 100, in accordance with an embodiment that is described herein.

The virtual fuse bay of FIG. 2 may be used in implementing virtual fuse bay 44 of FIG. 1 above. In the example of FIG. 2, virtual fuse bay 100 comprises physical fuse bays 104A and 104B. In alternative embodiments, however, any suitable number of fuse bays other than two can also be used. Each of the physical fuse bays comprises data fuses 108 and metadata fuses 112. The metadata fuses may be further classified into control fuses and parity fuses, wherein the parity fuses store parity bits that were calculated for data bits, and the control fuses store information used for accessing data fuses and parity fuses.

In the example of FIG. 2, each of the fuse bays comprises 512 data fuses, accessible as 16 Fuse Words (FWs), each of which comprises 32 fuses so that the values in the 32 fuses together form the corresponding FW. The FWs are addressable contiguously across the physical fuse bays, e.g., the FWs in fuse bay 104A are numbered FW0 . . . WF15, whereas the FWs in fuse bay 104B are numbered starting with FW16.

The BISR controller may store data in the fuse bays in multiple sessions, which may differ from one another in ambient temperature, or which may be performed before and after packaging, for example. In an embodiment, the number of fuses to be programmed in each session is not necessarily a multiple of the FW width (32 bits).

To protect the data bits stored in the data fuses, the ECC controller manages ECC Regions (ERs) in the metadata fuses, in multiple entries associated with respective ECC regions. Each entry in the metadata fuses specifies a range of data fuses among the data fuses, and parity bits corresponding to the data bits stored in these data fuses. In the present example, each ER stores 128 data bits in 128 data fuses.

Consider, for example, a first session in which the BISR controller writes 416 bits to the virtual fuse bay, and a second session in which the BISR controller writes additional 256 bits. In this example, the 416 bits occupy three full ECC regions denoted ER1 . . . . ER3, each of these ERs containing four 32-bit words, and a partial ECC region denoted ER4 storing the remaining 32 bits. In the second session, ECC region ER5 starts at FW13 and ends at FW16 (128 bits), and ECC region ER6 starts at FW17 and ends at FW20 (128 bits).

As noted above, in some embodiments the underlying ECC scheme encodes input bits to generate parity bits (For example encode 128 input bits to generate 8 parity bits—a code word of 136 bits). When an ECC region specified in the metadata fuses contains less than the required number of input bits for the ECC, the ECC controller pads the remaining bits to complete to the number of input bits required by the ECC. In the example above, ECC region ER4 stores only 32 bits of FW12, and therefore needs to be padded with 96 padding bits before calculating the parity bits for that region. The padding bits may comprise, for example, zero bits, or any other suitable bit values.

Figure 3:
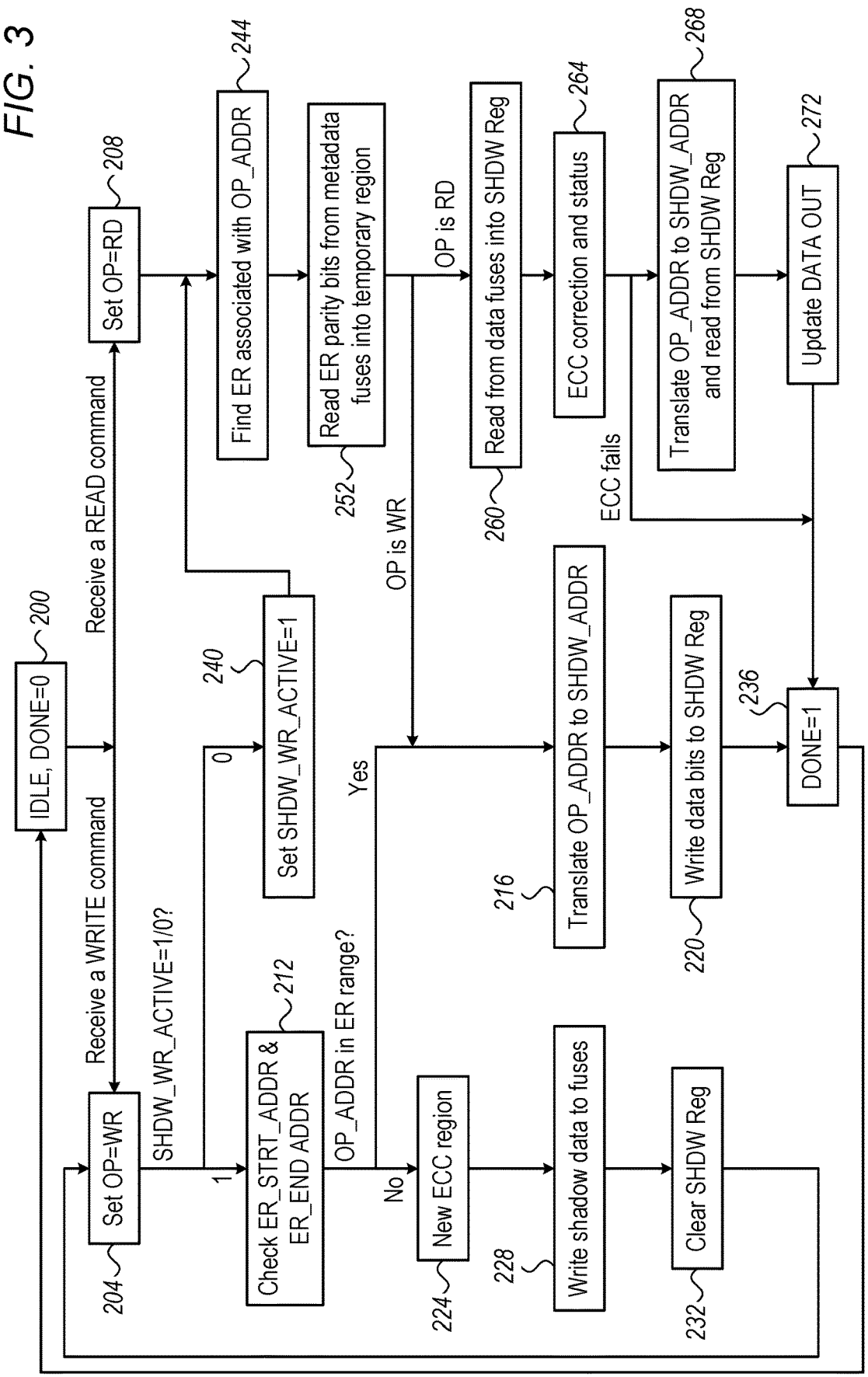
FIG. 3 is a flow chart that schematically illustrates a method for managing a reliable fuse storage using an Error Correction Code (ECC), in accordance with an embodiment that is described herein.

FIG. 3 is a flow chart that schematically illustrates a method for managing a reliable fuse storage using an Error Correction Code (ECC), in accordance with an embodiment that is described herein.

The method of FIG. 3 will be described as executed by ECC controller 40 of FIG. 1. The method begins at an idle operation 200, with ECC controller 40 resetting a DONE flag, and waiting for receiving a read command or a write command from BISR controller 28. In response to receiving a write command, the ECC controller sets an operation variable OP=WR at a write setting operation 204. The write command provides 32 input data bits and an address (denoted OP_ADDR) in the fuse bay to which the data bits are to be written. In response to receiving a read command, the ECC controller sets the operation variable OP=RD, at a read setting operation 208. The read command specifies an address (OP_ADDR) in the fuse bay from which to read 32 data bits. The address OP_ADDR in the write command or read command is indicative of a respective 32-bit Fuse Word (FW) in the physical fuse bay (48).

Further at operation 204, the ECC controller checks whether a SHDW_WR_ACTIVE flag is set, and if so, proceeds to a range checking operation 212. At operation 212 the ECC controller checks whether the OP_ADDR falls in the current ER having start and end addresses denoted ER_STRT_ADDR and ER END_ADDR, respectively. In an embodiment, at operation 212 the ECC controller checks the condition (OP_ADDR<ER_STRT_ADDR)||(OP_ADDR>ECC END_ADDR) that when met indicates that OP_ADDR is outside the current ER. If the OP_ADDR falls within the address range of the current ER, the ECC controller translates the OP_ADDR to a shadow address SHDW_ADDR in shadow register 46, at a translation operation 216, and writes the 32 data bits to the SHDW_ADDR, at a shadow writing operation 220. Following operation 220, the ECC controller sets the DONE flag at a done operation 236, and loops back to operation 200 to wait for a subsequent command. In some embodiments, the ECC controller fills Word0 . . . Word3 by receiving four write commands while the SHDW_WR_ACTIVE flag is set.

If at operation 212 above the address OP_ADDR falls outside the current ER boundaries, the ECC controller starts a new ECC region at an ER starting operation 224, and copies (or moves) the data from the shadow register to the fuse bay at a write fuses operation 228 as follows: (i) write the data currently stored in Word0 . . . . Word3 of the shadow register to the data fuses (at location OP_ADDR), and store the start and end addresses to temporary region 56 (ii) calculate parity bits for the data in the shadow register using ECC parity generator 52, and store the parity bits in temporary region 56 (e.g., using the ECC_Calc signal), and (iii) write the parity bits, and the start and end addresses of the new ER (currently present in the temporary region) to the metadata fuses associated with the new ER.

At a shadow clearing operation 232, the ECC controller clears the content of Word0 . . . . Word3 in the shadow register. In addition, the ECC controller resets the SHADW_WR_ACTIVE flag. Following operation 232, the ECC controller loops back to operation 204 with SHDW_WR_ACTIVE reset (and then to operation 240).

When at operation 204 SHDW_WR_ACTIVE is reset, the ECC controller sets the SHDW_WR_ACTIVE flag at a shadow active marking operation 240. Following operation 240 or 208, ECC controller 40 finds in the metadata fuses an ER associated with the OP_ADDR, at an ER determination operation 244. To this end, the ECC controller reads from the metadata fuses the current ER boundary addresses STRT_ADDR and END_ADDR, compares between OP_ADDR and END_ADDR, and continues to the next ER in the metadata fuses, while repeating this sequence until the condition (END_ADDR≥OP_ADDR) is met.

At a shadow register updating operation 252, the ECC controller reads the parity bits from the metadata fuses associated with the ER found at operation 244 into temporary region 56. At this point the temporary region contains the STRT_ADDR, END_ADDR and parity bits associated with the ER found at operation 244.

Following operation 252 the method splits between write and read operations. When performing a write operation, the ECC controller proceeds to operation 216 to write 32 bits that were read from the data fuses into the shadow register. Otherwise, the underlying operation is a read operation, and the ECC controller reads up to 128 data bits from the data fuses associated with the ER into the shadow register at a read into shadow register operation 260. At operation 260, reading the 128 data bits requires four accesses to the data fuses.

At a data correction operation 264, the ECC controller performs ECC decoding to the data in the shadow register to correct errors, using ECC correction module 60, and produces corresponding ECC status, as described above.

When the ECC status indicates that the ECC decoding has failed, the ECC controller proceeds to operation 236 to set the DONE flag and loops back to operation 200. Otherwise, ECC decoding has succeeded, and the ECC controller proceeds to a shadow register reading operation 268. At operation 268, the ECC controller translates the OP_ADDR to a SHOW ADDR and reads the corrected data from the shadow register. At an output operation 272 the ECC controller updates the Data Out lines with the 32 data bits corresponding to OP_ADDR of the read command, and proceeds to operation 236 to set the DONE flag and loop back to operation 200.

Figure 4:
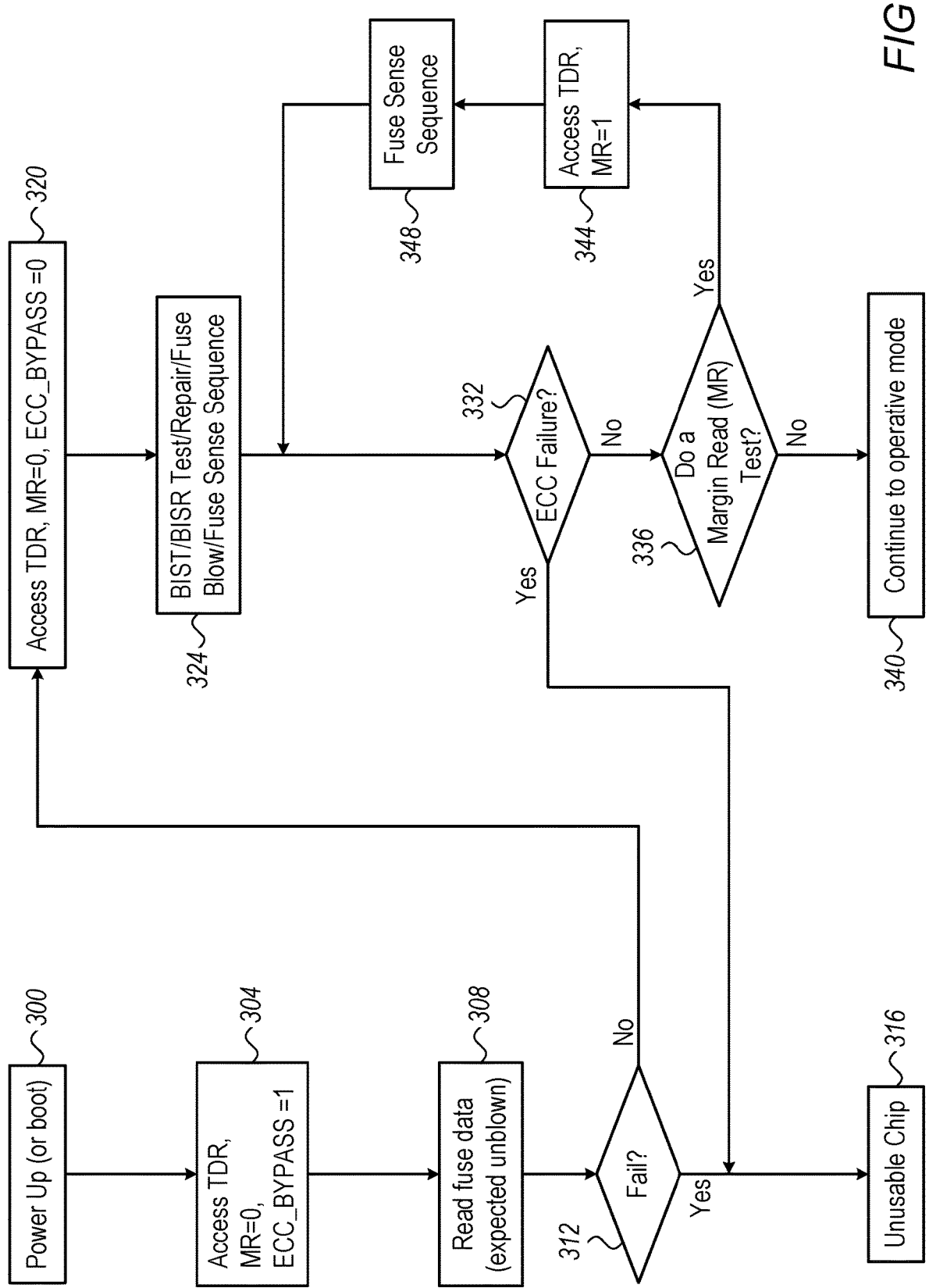
FIG. 4 is a flow chart that schematically illustrates a method for testing a chip after manufacturing, in accordance with an embodiment that is described herein.

FIG. 4 is a flow chart that schematically illustrates a method for testing a chip after manufacturing, in accordance with an embodiment that is described herein.

It is assumed that before executing the method, all the eFuses embedded in the chip under test are unblown, because no data bits have been yet written to them.

The method performs an initial test that does not involve ECC, followed by a full test in which the fuses are written and read with ECC protection.

The example method described herein is controlled using a Margin Read test flag denoted "MR", and an ECC bypass flag denoted "ECC_BYPASS". In the initial test, the ECC bypass flag is set, to allow the BISR controller to read the data stored in the fuses directly, without attempting to correct any errors. The MR flag indicates whether a MR test is required or not. The MR test may be used for checking whether the data read from the fuses are correctable in various conditions, e.g., in worst case conditions, by modifying the threshold applied in reading the binary values of the physical fuses.

In some embodiments, the chip comprises a Test Data Register (TDR), which the manufacturing test equipment can access for controlling the chip operation in test mode. TDR is part of the Joint Test Action Group (JTAG) standard by the IEEE, which is used for post-manufacturing tests and is accessible from manufacturing test equipment in order to manage BISR controller operations.

The method of FIG. 4 begins with a power up (or boot) operation 300, at which point power is provided to the chip under test. At a non-ECC test initialization operation 304, the manufacturing test equipment accesses the TDR to clear the MR flag, and sets the ECC bypass flag. At a raw reading operation 308, the BISR controller reads the fuses in the virtual fuse bay without applying any MR test and without applying the ECC scheme. At this test, since no data has yet been written to the fuses, they are expected to read as unblown (e.g., binary value '0'). At a verification operation 312, the BISR controller checks whether the test has failed (e.g., at least one fuse read as blown), and if so, indicates that the chip under test is nonfunctional, at an unusable indication operation 316. Otherwise, the test of operation 308 has passed, and the method proceeds to a full test initialization operation 320.

At operation 320, the manufacturing test equipment accesses the TDR to clear both the MR test flag and the ECC bypass flag. At a chip testing operation 324, the chip performs a Built-In Self-Test (BIST) to test the chip and accumulates memory or other repair information, and then the BISR controller gathers repair data in accordance with the test results. The BISR controller writes the repair data to the virtual fuse bay via ECC controller 40 as described above, and reads back the data stored in the physical fuses while applying ECC decoding to correct erroneous data bits (and/or parity bits) using the underlying ECC scheme. During the full test, if any of the data read fuses are uncorrectable, the ECC controller sets the ECC status flag to indicate a failure.

At a failure query operation 332, if the ECC status indicates that ECC decoding has failed, the method proceeds to operation 316 to indicate that the chip is unusable. Otherwise, the data read from all the fuses are correctable, and the BISR controller checks whether a MR test is required, at a MR test query operation 336.

If no MR test is required, the method proceeds to an operative mode operation 340 of the chip. Otherwise, the manufacturing test equipment accesses the TDR to set the MR test flag at a MR test initialization operation 344 (the ECC bypass flag has already been cleared at operation 320 above). The BISR controller then reads the fuses again in worst case conditions, at a fuse sensing operation 348 (while applying ECC to the read data), and loops back to operation 332 to check the ECC status, as described above. If during the MR test an ECC failure occurs, the method indicates an unusable chip at operation 316 described above.

The configurations of IC 20 and BISR system 24 in FIG. 1 are given by way of example, and other suitable IC and BISR system configurations can also be used.

The different elements of IC 20 and BISR system 24 and their components such as Fuse manager 32 may be implemented using dedicated hardware or firmware, such as using hard-wired or programmable logic, e.g., in an Application-Specific Integrated Circuit (ASIC) or Field-Programmable Gate Array (FPGA). Additionally or alternatively, some functions of Fuse manager 32, e.g., functions of ECC controller 40 and ECC parity generator 52, may be implemented in software and/or using a combination of hardware and software elements. Elements that are not mandatory for understanding of the disclosed techniques have been omitted from the figure for the sake of clarity.

The embodiments described above are given by way of example, and other suitable embodiments can also be used.

For example, although in the embodiments above the ECC region contains 128 bits, ER regions having a number of data bits other than 128 can also be used. As another example, although in the embodiments above, physical fuses are accessed in chunks of 32 fuses (or 32 bits), this is not mandatory. In alternative embodiments, the physical fuses may be accessed in chunks having a number of bits other than 32. With ERs of 128 data bits and accessing chunks of 32 bits from the fuse bays, four words are required in the rewritable memory. With other ER sizes and chunk sizes, the rewritable memory may have a number of words other than four.

In the embodiments described above, the ER size may be set constant for a given application. In alternative embodiments, however, ERs having different respective number of data bits, for the same application, can also be used. In such embodiments, different ECC schemes may be applied depending on the ER sizes.

Although the embodiments described herein mainly address using electronic fuses for repairing memories, the methods and systems described herein can also be used in other applications, such as in using one-time programmable memories for storing any data in a highly reliable fashion on an IC.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus for reliable fuse-based storage in an Integrated Circuit (IC), the apparatus comprising:
   a plurality of electronic fuses configured to store (i) data bits, (ii) parity bits that were generated from the data bits in accordance with an Error Correction Code (ECC) scheme, and (iii) access information required for accessing the data bits and the parity bits;
   an ECC module, configured to apply the ECC scheme to the data bits and corresponding parity bits for correcting errors in the data bits; and
   processing logic configured to:
      receive, from a Built-In Self-Repair (BISR) controller, a read command for reading given data bits from the electronic fuses; and
      respond to the read command while rendering the BISR controller unaware of the ECC scheme, by:
         based on the read command, retrieving the access information specifying given electronic fuses storing the given data bits and given parity bits associated with the given data bits;
         reading, using the access information, the given data bits and the given parity bits from the given electronic fuses;
         applying the ECC scheme to the given data bits and the given parity bits, using the ECC module, to generate corrected data bits; and outputting the corrected data bits to the BISR controller.

2. The apparatus for reliable fuse-based storage according to claim 1, wherein the processing logic is configured to retrieve the access information by reading a start location and an end location of a range of the electronic fuses among the plurality of electronic fuses.

3. The apparatus for reliable fuse-based storage according to claim 1, wherein, by rendering the BISR controller unaware of the ECC scheme, the processing logic is configured to provide the BISR controller with reliable indirect access to data stored in the plurality of electronic fuses.

4. The apparatus for reliable fuse-based storage according to claim 3, wherein the BISR controller is coupled to the apparatus via an interface supporting generic signals that are applicable by the BISR controller for direct access to electronic fuses other than the electronic fuses in the plurality of electronic fuses.

5. The apparatus for reliable fuse-based storage according to claim 1, wherein the processing logic comprises a rewritable memory, which is configured to store temporary data bits to be written to the electronic fuses or read from the electronic fuses, and wherein the processing logic is configured to calculate temporary parity bits corresponding to the temporary data bits in the rewritable memory using the ECC module.

6. The apparatus for reliable fuse-based storage according to claim 5, wherein a number of the temporary data bits is smaller than an input size required by the ECC scheme, and wherein the processing logic is configured to pad the temporary data bits with one or more padding bits to complete the input size required by the ECC scheme.

7. The apparatus for reliable fuse-based storage according to claim 1, wherein the processing logic is configured, prior to writing any data to the plurality of electronic fuses, to perform a fuse test for verifying that the electronic fuses being initially unblown, under control of an external device by disabling the ECC module and providing direct access to the electronic fuses.

8. The apparatus for reliable fuse-based storage according to claim 1, wherein the ECC module supports multiple ECC schemes, and wherein the processing logic is configured to select one of the ECC schemes depending on a number of the given data bits.

9. The apparatus for reliable fuse-based storage according to claim 1, wherein the processing logic is configured to:
receive a write command specifying input data bits, and an address indicative of first electronic fuses for storing the input data bits;
apply the ECC scheme to the input data bits, using the ECC module, to generate input parity bits corresponding to the input data bits;
determine access information indicative of the first electronic fuses, and of second electronic fuses for storing the input parity bits; and
store (i) the input data bits in the first electronic fuses, (ii) the input parity bits in the second electronic fuses, and (iii) the access information in third electronic fuses.

10. A method for reliable fuse-based storage in an Integrated Circuit (IC), the method comprising:
in an apparatus comprising a plurality of electronic fuses storing (i) data bits, (ii) parity bits that were generated from the data bits in accordance with an Error Correction Code (ECC) scheme, and (iii) access information required for accessing the data bits and the parity bits;
receiving, from a Built-In Self-Repair (BISR) controller, a read command for reading given data bits from the electronic fuses; and
responding to the read command while rendering the BISR controller unaware of the ECC scheme, by:
based on the read command, retrieving the access information specifying given electronic fuses storing the given data bits and given parity bits associated with the given data bits;
reading, using the access information, the given data bits and the given parity bits from the given electronic fuses;
applying the ECC scheme to the given data bits and the given parity bits to generate corrected data bits; and
outputting the corrected data bits to the BISR controller.

11. The method according to claim 10, wherein retrieving the access information comprises reading a start location and an end location of a range of the electronic fuses among the plurality of electronic fuses.

12. The method according to claim 10, wherein rendering the BISR controller unaware of the ECC scheme comprises providing the BISR controller with reliable indirect access to data stored in the plurality of electronic fuses.

13. The method according to claim 12, wherein the BISR controller is coupled to the apparatus via an interface supporting generic signals that are applicable by the BISR for direct access to electronic fuses other than the electronic fuses in the plurality of electronic fuses.

14. The method according to claim 10, wherein the apparatus comprises a rewritable memory that stores temporary data bits to be written to the electronic fuses or read from the electronic fuses, comprising calculating temporary parity bits corresponding to the temporary data bits in the rewritable memory using the ECC module.

15. The method according to claim 14, wherein a number of the temporary data bits is smaller than an input size required by the ECC scheme, and comprising padding the temporary data bits with one or more padding bits to complete the input size required by the ECC scheme.

16. The method according to claim 10, further comprising, prior to writing any data to the plurality of electronic fuses, performing a fuse test for verifying that the electronic fuses being initially unblown, under control of an external device by disabling the ECC module and providing direct access to the electronic fuses.

17. The method according to claim 10, wherein the apparatus supports multiple ECC schemes, and comprising selecting one of the ECC schemes depending on a number of the given data bits.

18. The method according to claim 10, and comprising:
receiving a write command specifying input data bits, and an address indicative of first electronic fuses for storing the input data bits;
applying the ECC scheme to the input data bits to generate input parity bits corresponding to the input data bits;
determining access information indicative of the first electronic fuses, and of second electronic fuses for storing the input parity bits; and
storing (i) the input data bits in the first electronic fuses, (ii) the input parity bits in the second electronic fuses, and (iii) the access information in third electronic fuses.

* * * * *